(12) United States Patent
Hunt-Schroeder et al.

(10) Patent No.: US 11,101,010 B2
(45) Date of Patent: Aug. 24, 2021

(54) SENSING CIRCUITS FOR CHARGE TRAP TRANSISTORS

(71) Applicant: GLOBALFOUNDRIES INC., Grand Cayman (KY)

(72) Inventors: Eric D. Hunt-Schroeder, Essex Junction, VT (US); Sebastian T. Ventrone, South Burlington, VT (US); James A. Svarczkopf, Essex Junction, VT (US); Igor Arsovski, Williston, VT (US)

(73) Assignee: MARVELL ASIA PTE, LTD., Singapore (SG)

( * ) Notice: Subject to any disclaimer, the term of this patent is extended or adjusted under 35 U.S.C. 154(b) by 0 days.

(21) Appl. No.: 16/568,394

(22) Filed: Sep. 12, 2019

(65) Prior Publication Data

US 2021/0082532 A1   Mar. 18, 2021

(51) Int. Cl.
*G11C 17/18* (2006.01)
*G11C 7/06* (2006.01)
*G11C 7/08* (2006.01)
*G11C 11/409* (2006.01)

(52) U.S. Cl.
CPC ............. *G11C 17/18* (2013.01); *G11C 7/06* (2013.01); *G11C 7/065* (2013.01); *G11C 7/08* (2013.01); *G11C 11/409* (2013.01)

(58) Field of Classification Search
CPC .. G11C 7/06; G11C 7/065; G11C 7/08; G11C 11/409; G11C 17/18

USPC .................................. 365/208, 181, 104
See application file for complete search history.

(56) References Cited

U.S. PATENT DOCUMENTS

| 8,742,830 | B2 | 6/2014 | Luo et al. |
| 9,779,783 | B2* | 10/2017 | Anand ................... G11C 17/18 |
| 9,953,727 | B1 | 4/2018 | Fifield et al. |
| 2016/0217832 | A1* | 7/2016 | Jayaraman ............... G11C 7/08 |
| 2018/0075921 | A1 | 3/2018 | Fifield et al. |

OTHER PUBLICATIONS

Hunt-Schroeder, Eric; Anand, Darren; Fifield, John: Jacunski, Mark; Roberge, Michael; Pontius, Dale; Batson, Kevin; Kirihata, Toshiaki; 14nm FinFET 1.5Mb Embedded High-K Charge Trap Transistor One Time Programmable Memory Using Dynamic Adaptive Programming; Globalfoundries, VT USA, NY USA Symposium on VLSI Circuits Digest of Technical Papers; 2018.

* cited by examiner

*Primary Examiner* — Son L Mai

(57) ABSTRACT

The present disclosure relates to a structure including a first delay path circuit which is configured to receive an input signal and is connected to a complement transistor of a twin cell transistor pair through a complement bitline signal, a second delay path circuit which is configured to receive the input signal and is connected to a true transistor of the twin cell transistor pair through a true bitline signal, and a logic circuit which is configured to receive a first output of the first delay path circuit and a second output of the second delay path circuit and output a data output signal.

15 Claims, 5 Drawing Sheets

SENSING CIRCUITS FOR CHARGE TRAP TRANSISTORS

FIELD OF THE INVENTION

The present disclosure relates to sensing circuits, and more particularly, to sensing circuits and a method for sensing charge trap transistors.

BACKGROUND

A one time programmable memory (OTPM) is a charge trap transistor based non-volatile memory which contains a twin cell circuit. In the twin cell circuit, data is stored when electrons are trapped in a gate dielectric. The trapped electrons (i.e., trapped charge) lead to a threshold voltage (Vt) shift on either the true transistor or complement transistor, which weakens the device.

In conventional circuits, a differential current sense amplifier is used to sense a current threshold voltage (Vt) between a true transistor and a complement transistor. However, the conventional circuits are slow to sense the data. Therefore, improved sensing circuits are needed to perform a faster sensing operation.

SUMMARY

In an aspect of the disclosure, a structure includes a first delay path circuit which is configured to receive an input signal and is connected to a complement transistor of a twin cell transistor pair through a complement bitline signal, a second delay path circuit which is configured to receive the input signal and is connected to a true transistor of the twin cell transistor pair through a true bitline signal, and a logic circuit which is configured to receive a first output of the first delay path circuit and a second output of the second delay path circuit and output a data output signal.

In another aspect of the disclosure, a circuit includes a twin cell transistor pair which is activated by a wordline, a first cross-coupled transistor which is connected to the twin cell transistor pair through a true bitline signal, and a second cross-coupled transistor which is connected to the twin cell transistor pair through a complement bitline signal.

In another aspect of the disclosure, a method includes programming one of a true transistor and a complement transistor of a twin cell transistor pair, comparing a first delay through a first delay path circuit connected to the complement transistor with a second delay through a second delay path circuit connected to the true transistor after programming one of the true transistor and the complement transistor, sensing a threshold voltage difference between the true transistor and the complement transistor based on a comparison of the first delay with the second delay, and outputting a data signal based on the sensed threshold voltage difference between the true transistor and the complement transistor.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to sensing circuits, and more particularly, to sensing circuits and a method for sensing charge trap transistors. In specific embodiments, the sensing can be performed using a delay based approach which races two signals to a data port and a clock port of a Flip-Flop circuit. Further, a charge trap transistor (CTT) non-volatile memory includes a write function that enables an initial random state to be overcome with a write operation to a known, repeatable margin. A differential wordline is used for margining a threshold voltage during write operations. In a read operation, a wordline voltage is set to a high gain point, which is a statistical average of a twin cell threshold voltage plus some additional overdrive voltage.

In embodiments, a sensing technique is disclosed with two identical paths which are raced against each other to determine data stored in a twin cell transistor pair. In the sensing technique, a path to ground (i.e., a power supply VSS) is connected using a bitline complement or a bitline true and enabled by a wordline activation in a memory array. The twin cell can be activated by a wordline voltage. The wordline voltage is set at a statistical average of the mean threshold voltage of the twin cell transistor pair plus some overdrive voltage. After programming (i.e., a write operation), one transistor is severely weakened. In this write operation, a threshold voltage (Vt) of a transistor of a twin cell is shifted upwards. The activation of the twin cell by the wordline voltage which resulted in a weakened transistor will significantly increase a delay in one path. In comparison to typical sense amplifiers, which take approximately 10 nanoseconds to sense data, the sensing circuits of the disclosure can sense data in approximately 1 nanosecond.

Figure 1:
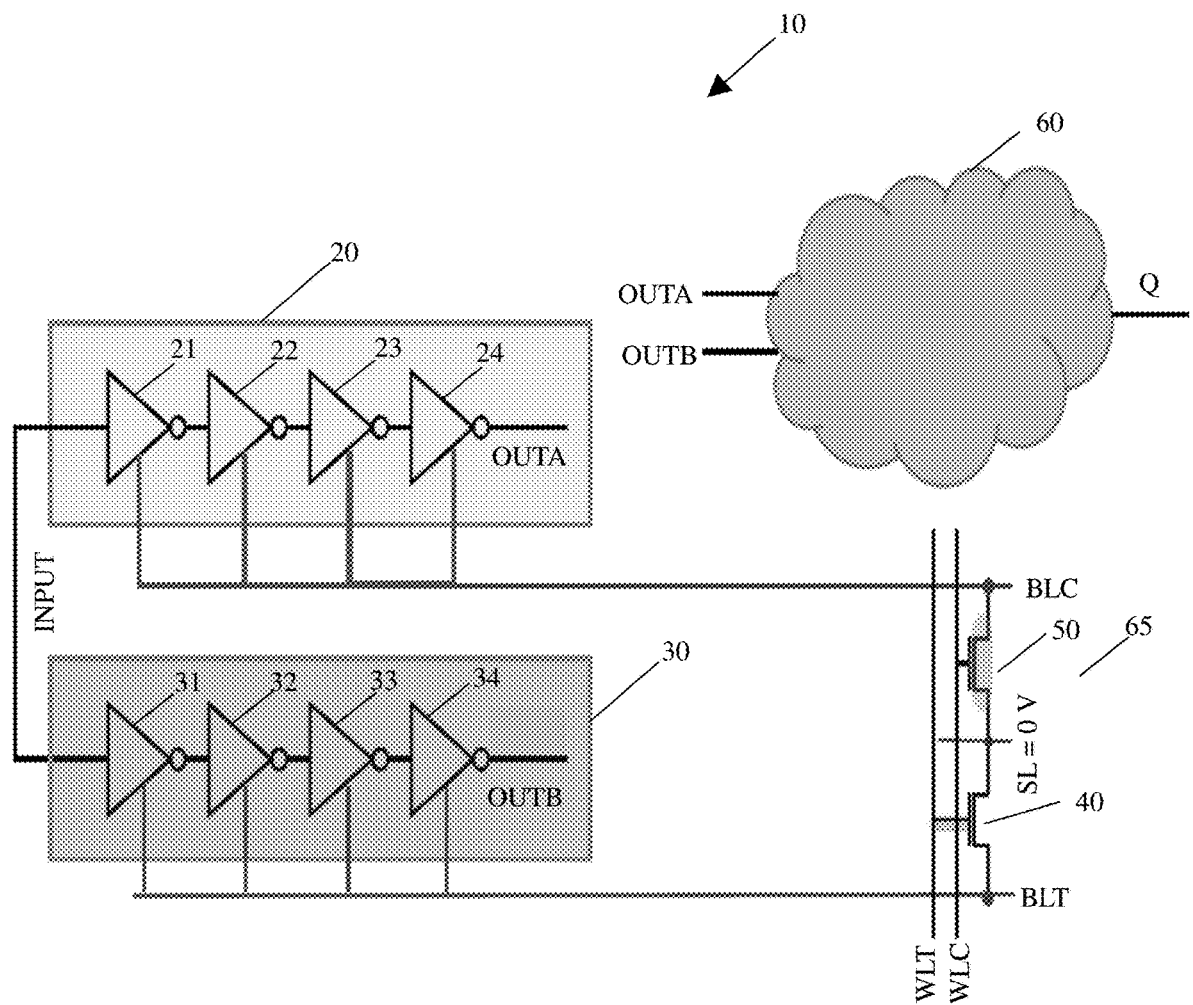
FIG. 1 shows an overview of a delay based sensing circuit in accordance with aspects of the present disclosure.

FIG. 1 shows an overview of a delay based sensing circuit in accordance with aspects of the present disclosure. In FIG. 1, a delay based sensing circuit 10 includes a first delay block 20 with a plurality of inverters 21, 22, 23, and 24. Each of the inverters 21, 22, 23, and 24 can include an NFET footer and can be enabled by a complement bitline signal BLC. In embodiments, the first delay block 20 can be an N-stage delay path with N number of inverters (e.g., N being a positive integer value). Accordingly, it should be understood that the present disclosure is not limited to four inverters, and, instead, any number of inverters are contemplated herein. Alternatively, the N-stage delay path can include N number of NOR gates, N number of Tri-Buffer Inverters, N number of NAND gates, or other N number of circuit elements which introduce delays in the N-stage delay path.

In the embodiment shown, the first delay block 20 receives an INPUT signal to the inverter 21, which delays the INPUT signal and outputs the delay signal to the inverter 22. The remaining inverters (i.e., inverters 22, 23, and 24) will provide subsequent delay signals in a serial manner, which then will be outputted as an OUTA signal to a logic cloud 60.

In FIG. 1, the delay based sensing circuit 10 also includes a second delay block 30 with a plurality of inverters 31, 32, 33, and 34. Each of the inverters 31, 32, 33, and 34 can include an NFET footer and can be enabled by a true bitline signal BLT. In embodiments, the second delay block 30 can be an N-stage delay path with N number of inverters (e.g., N being a positive integer value). It should be understood that the present disclosure is not limited to four inverters, and, instead, any number of inverters are contemplated herein. Alternatively, the N-stage delay path can include N number of NOR gates, N number of Tri-Buffer Inverters, N number of NAND gates, or other N number of circuit elements which introduce delays in the N-stage delay path. In embodiments, the second delay block 30 receives an INPUT signal to the inverter 31, which delays the INPUT signal and outputs the delay signal to the inverter 32. The remaining inverters (i.e., inverters 32, 33, and 34) will provide subsequent delay signals in a serial manner, which will then be outputted as an OUTB signal to the logic cloud 60. After receiving the OUTA and OUTB signals, the logic cloud 60 outputs a logic cloud output Q signal.

The first delay block 20 and the second delay block 30 have identical delay circuit paths with connections through a complement bitline signal BLC and a true bitline signal BLT, respectively. Therefore, the first delay block 20 and the second delay block 30 may have different delays relative to each other depending on the true bitline signal BLT and the complement bitline signal BLC (which are affected by the strength or weakness of the true transistor 40 and the complement transistor 50 threshold voltages (Vt)).

In FIG. 1, the delay based sensing circuit 10 further includes a twin cell transistor pair 65 which includes a true transistor 40 and a complement transistor 50. In particular, the true transistor 40 has a source connected to the true bitline signal BLT, a gate connected to a true wordline WLT, and a drain connected to a source of the complement transistor 50. Further, the complement transistor 50 has a gate connected to a complement wordline WL and a drain connected to the complement bitline signal BLC. The pull down path to ground (i.e., VSS) is through the twin cell transistor pair 65.

In operation, the twin cell transistor pair 65 is programmed such that one transistor of the twin cell transistor pair 65 (i.e., one of the true transistor 40 and the complement transistor 50) is weakened from the programming (i.e., the threshold voltage (Vt) is shifted up due to the programming). Based on the weakened transistor, one of the delay paths (i.e., the first delay block 20 or the second delay block 30) will have an increased delay.

During a read, the INPUT signal transitions from "0" to "1" (i.e., the read operation) and is passed through the first delay block 20 and the second delay block 30, where a race of the two input signals will result in one of the two input signals being delayed relative to the other input signal. As an example, if the INPUT signal to the first delay block 20 is delayed due to the weakened complement transistor 50 relative to the INPUT signal to the second delay block 30, then a "0" is loaded and latched in a latch circuit as the output Q signal. Alternatively, if the INPUT signal to the second delay block 30 is delayed due to the weakened true transistor 40 relative to the INPUT signal to the first delay block 20, then a "1" is loaded and latched in the latch circuit as the output Q signal. In FIG. 1, the delay based sensing circuit 10 determines (i.e., senses) data stored in the twin cell based on a write operation or intrinsic threshold voltage (Vt) mismatch.

Figure 2:
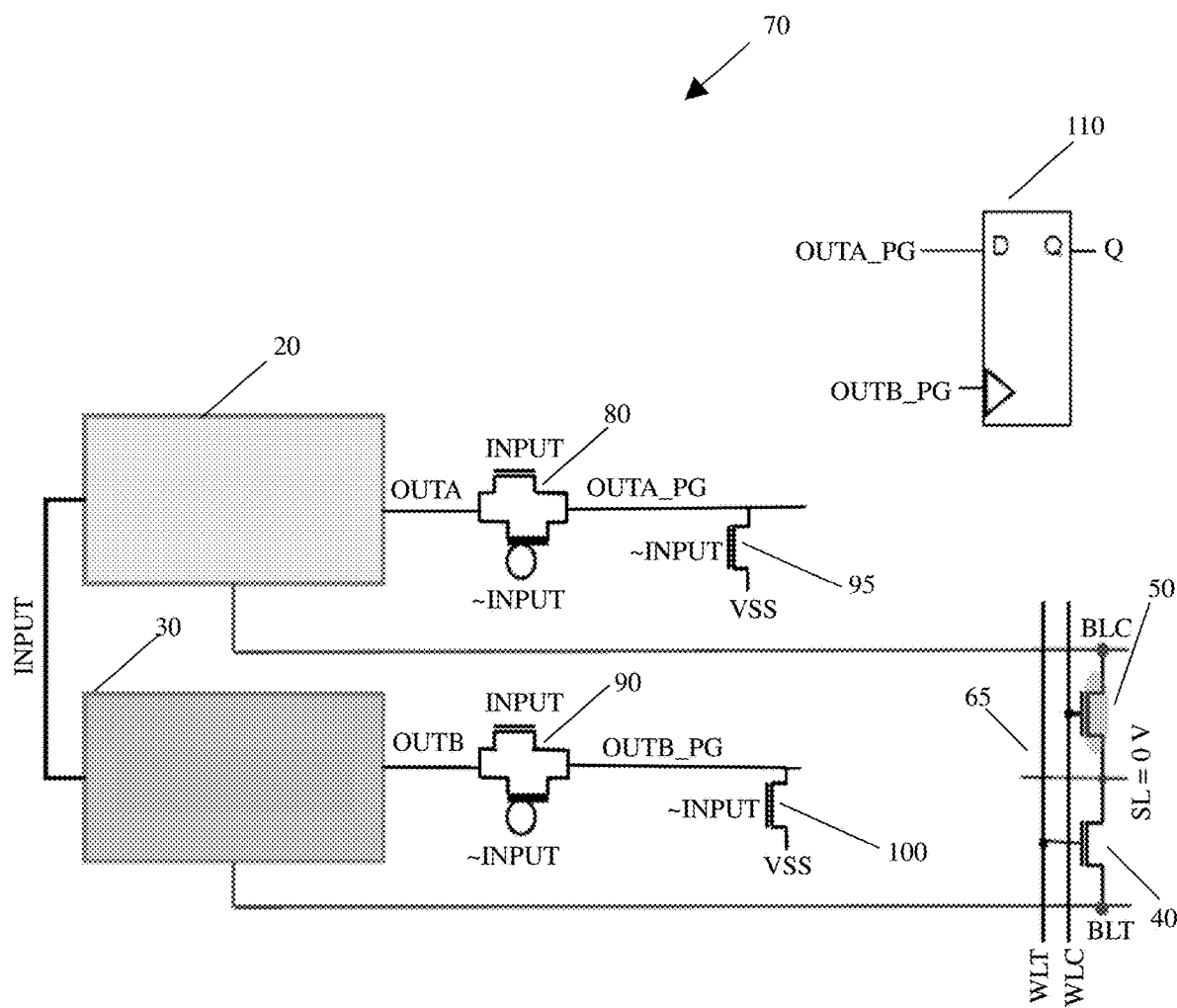
FIG. 2 shows an overview of another delay based sensing circuit in accordance with aspects of the present disclosure.

FIG. 2 shows an overview of a delay based sensing circuit in accordance with additional aspects of the present disclosure. The delay based sensing circuit 70 of FIG. 2 includes the first delay block 20, the second delay block 30, pass gates 80, 90, NMOS transistors 95, 100, and a D Flip-Flop Logic 110. In embodiments, the pass gate 80 receives the INPUT signal, an ~INPUT signal (i.e., the complement of the INPUT signal), and the OUTA signal for the first delay block 20. The pass gate 80 outputs an OUTA_PG signal. In addition, the NMOS transistor 95 has a drain connected to the OUTA_PG signal, a gate connected to the ~INPUT signal, and a source connected to ground (i.e., VSS).

Similarly, in the delay based sensing circuit 70 of FIG. 2, the pass gate 90 receives the INPUT signal, the ~INPUT signal (i.e., the complement of the INPUT signal), and the OUTB signal. The pass gate 90 outputs an OUTB_PG signal. The NMOS transistor 100 has a drain connected to the OUTB_PG signal, a gate connected to the ~INPUT signal, and a source connected to ground (i.e., VSS). In the delay based sensing circuit 70, the D Flip-Flop Logic 110 receives the OUTA_PG signal as the data input (i.e., D input) and the OUTB_PG signal as the clock input (i.e., CLK input), and outputs a D Flip-Flop output Q signal.

In operation, the twin cell transistor pair 65 is programmed such that one transistor of the twin cell transistor pair 65 (i.e., one of the true transistor 40 and the complement transistor 50) is weakened from the programming (i.e., the threshold voltage Vt is shifted due to the programming). Based on the weakened transistor, one of the delay paths (i.e., the first delay block 20 or the second delay block 30) will have an increased delay. Therefore, during programming, the INPUT signal is passed through the first delay block 20 and the second delay block 30, where a race of the two input signals will result in one of the two input signals being delayed relative to the other input signal.

As an example, if the INPUT signal to the first delay block 20 is delayed due to the weakened complement transistor 50 relative to the INPUT signal to the second delay block 30, then the OUTA_PG is input to the data input of the D Flip-Flop Logic 110 after the OUTB_PG is input to the clock input of the D Flip-Flop Logic 110, thereby causing a "0" to be loaded and latched in the latch circuit as the output Q signal. Alternatively, if the INPUT signal to the second delay block 30 is delayed due to the weakened true transistor 40 relative to the INPUT signal to the first delay block 20, then the OUTB_PG is input to the clock input of the D Flip-Flop Logic 110 after the OUTA_PG is input to the data input of the D Flip-Flop Logic 110, thereby causing a "1" to be loaded and latched in the latch circuit as the output Q signal. In FIG. 2, the delay based sensing circuit 70 determines (i.e., senses) data stored in the twin cell based on a write operation or the intrinsic threshold voltage (Vt). Also, the delay based sensing circuit 70 of FIG. 2 uses obfuscation to prevent a third party from knowing the output Q signal by simply using a nanoprobe to determine the differential threshold voltage (Vt) of the twin cell transistor pair 65.

Figure 3:
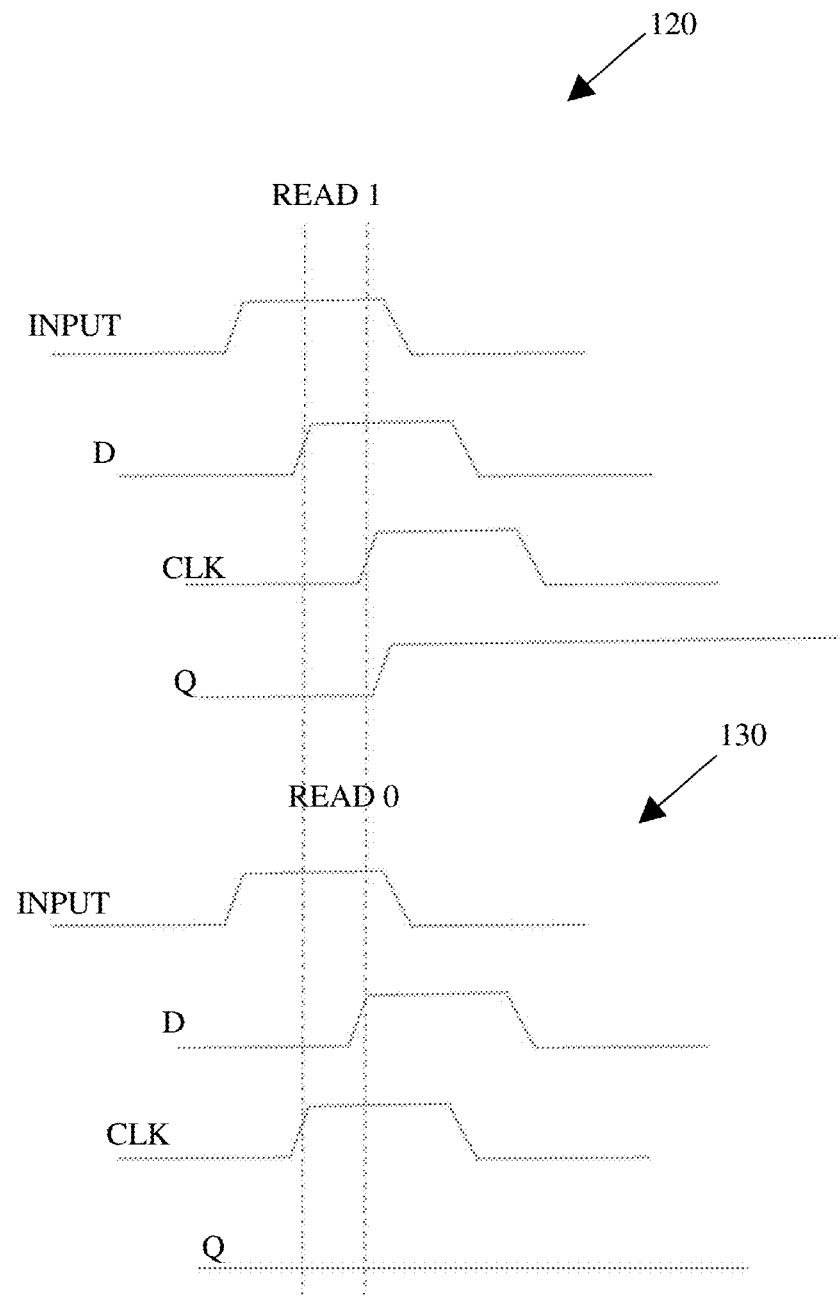
FIG. 3 shows timing graphs of the delay based sensing circuit of FIGS. 1 and 2 in accordance with aspects of the present disclosure.

FIG. 3 shows timing graphs of the delay based sensing circuit of FIGS. 1 and 2 in accordance with aspects of the present disclosure. In FIG. 3, the timing graph 120 is for a sensing/read operation of "1" at the output Q signal and the timing graph 130 is for a sensing/read operation of "0" at the output Q signal. In the timing graph 120, the INPUT signal is input to the first delay block 20 and the second delay block 30 of FIGS. 1 and 2. Further, the data input (i.e., the D input) of the Flip-Flop Logic 110 receives the OUTA_PG signal before the clock input (i.e., the CLK input) of the Flip-Flop Logic 110 receives the OUTB_PG signal due to the weakened true transistor 40. Therefore, the output Q signal of the Flip-Flop Logic has a "1" signal which is loaded and latched. Also, the logic cloud 60 receives the OUTA signal before the OUTB signal due to the weakened transistor, and the output Q signal of the logic cloud 60 has a "1" signal which is loaded and latched. The output Q signal of either the Flip-Flop Logic 110 or the logic cloud 60 is a sensed operation (i.e., read operation) of data that was performed from a previous write operation of the twin cell transistor pair 65.

In FIG. 3, in the timing graph 130, the INPUT signal is also input to the first delay block 20 and the second delay block 30 of FIGS. 1 and 2. Further, the clock input (i.e., the CLK input) of the Flip-Flop Logic 110 receives the OUTB_PG signal before the data input (i.e., the D input) of the Flip-Flop Logic 110 receives the OUTA_PG signal. This is due to the weakened true transistor 50. Accordingly, the output Q signal of the Flip-Flop Logic has a "0" signal which is loaded and latched. Also, the logic cloud 60 receives the OUTB signal before the OUTA signal due to the weakened transistor, and the output Q signal of the logic cloud 60 has a "0" signal which is loaded and latched. The output Q signal of either the Flip-Flop Logic 110 or the logic cloud 60 is a sensed operation (i.e., read operation) of data that was performed from a previous write operation of the twin cell transistor pair 65.

Figure 4:
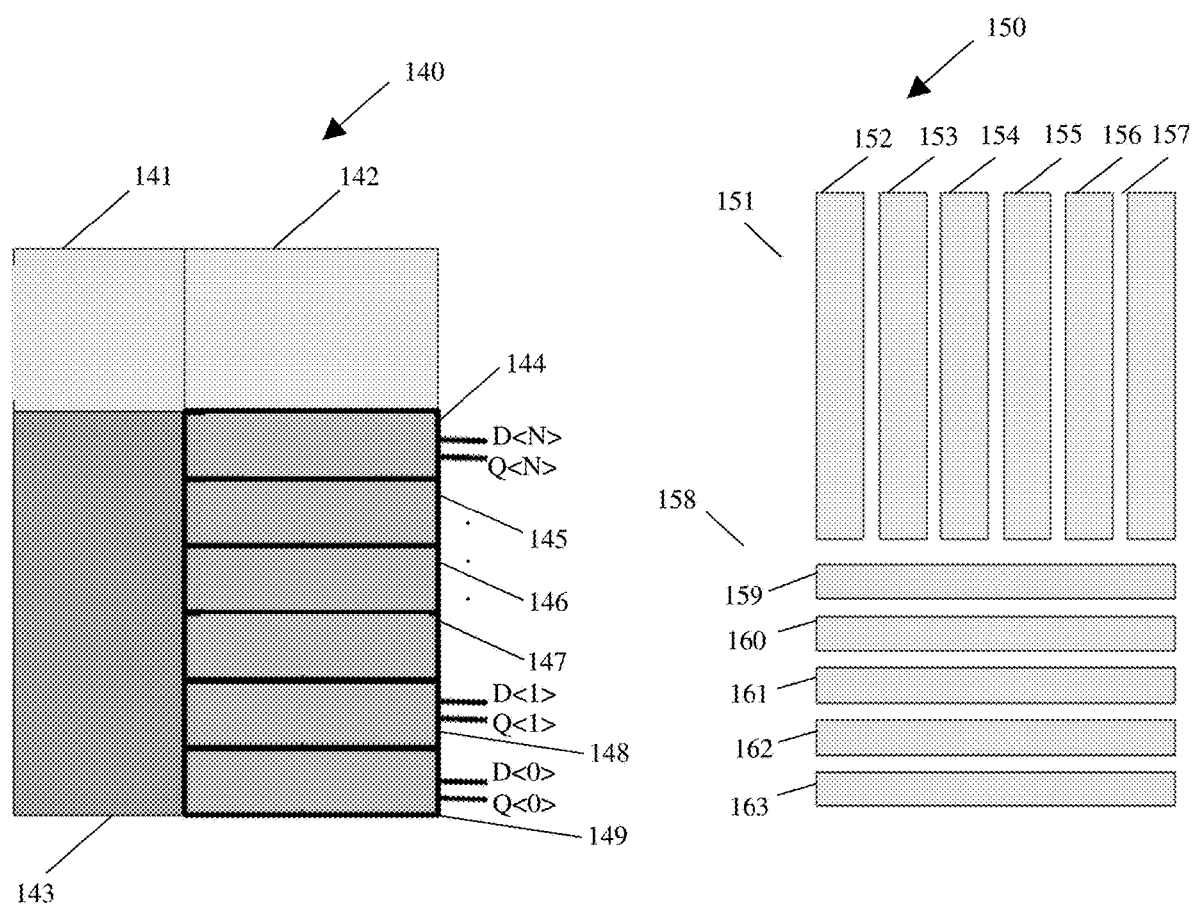
FIG. 4 shows an architecture of the delay based sensing circuit of FIGS. 1 and 2 in accordance with aspects of the present disclosure.

FIG. 4 shows an architecture of the delay based sensing circuit of FIGS. 1 and 2 in accordance with aspects of the present disclosure. In FIG. 4, a structure 140 includes a read voltage high/low generator 141, wordline drivers 142, a circuit structure 143, and first-sixth delay circuits 144, 145, 146, 147, 148, and 149. The read voltage high/low generator 141 is used to generate true wordline signals and complement wordline signals. The wordline drivers 142 drive the true wordline signals and complement wordline signals. The circuit structure 143 includes a source line (SL) regulator, write drivers, and source line (SL) clamps to ground (i.e., VSS). Further, each of the delay circuits 144, 145, 146, 147, 148, and 149 include a charge trap transistor (CT) cell, a delay path, a latch, and have data and Q output signals (similar to FIGS. 1 and 2). For example, the sixth delay circuit 149 can have Q<0> and D<0> output signals, the fifth delay circuit 148 can have Q<1> and D<1> output signals, etc., with the first delay circuit 144 having Q<n> and D<n> output signals.

Still referring to FIG. 4, a wiring layer 150 includes a set of M3 wires 151 (i.e., wires at the M3 level of the architecture) and a set of M1/M2 wires 158 (i.e., wires at the M1/M2 level of the architecture). The set of M3 wires 151 includes true wordline wires 152, 154, 156; and complement wordline wires 153, 155, and 157. The set of M1/M2 wires 158 includes source lines 159, 161, 163, a complement bitline 160, and a true bitline 162. The structure 140 and the wiring layer 150 are used to implement the delay based sensing circuits 10, 70 of FIGS. 1 and 2.

Figure 5:
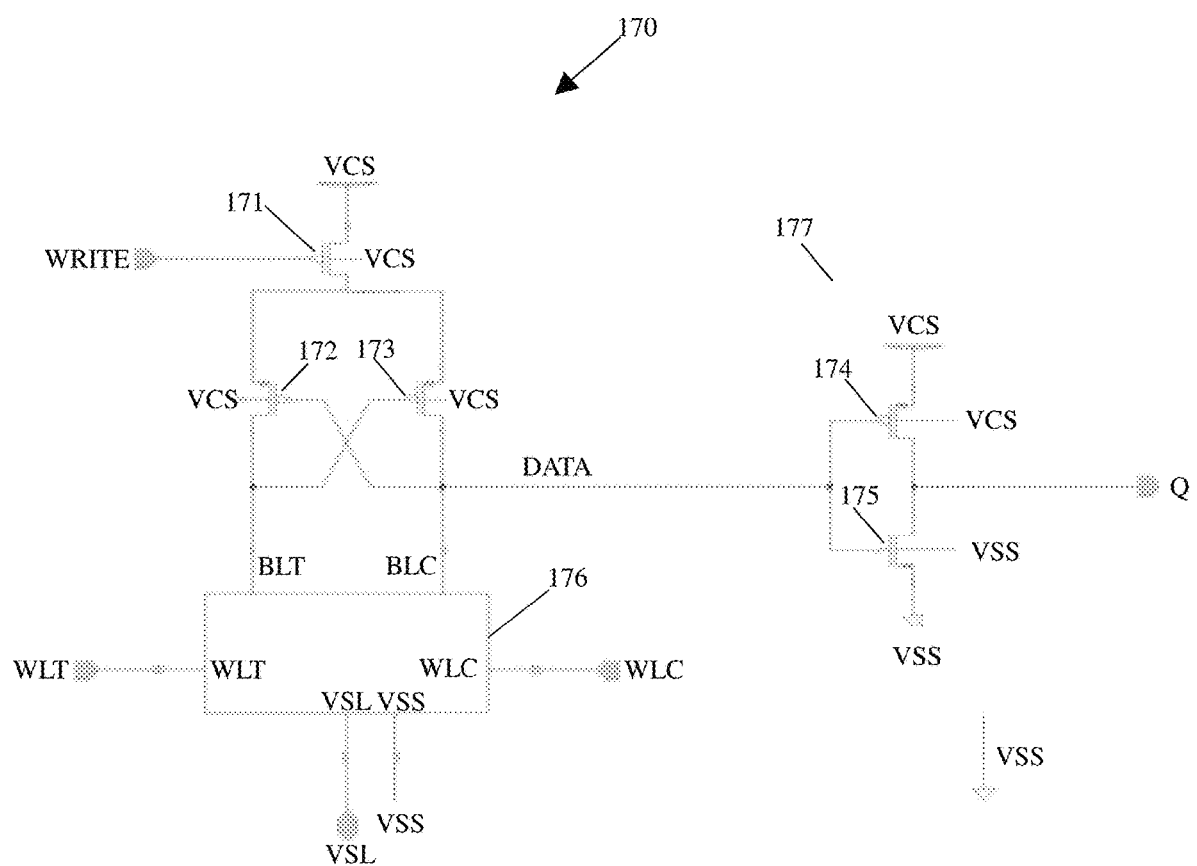
FIG. 5 shows a sensing circuit in accordance with additional aspects of the present disclosure.

FIG. 5 shows a sensing circuit in accordance with additional aspects of the present disclosure. In FIG. 5, the sensing circuit 170 includes a PMOS transistor 171 with a source connected to a power supply VCS, a gate connected to a WRITE signal, a back gate connected to the power supply VCS, and a drain connected to a source of a PMOS transistor 172. The PMOS transistor 172 has a gate connected to a DATA signal and a drain connected to a true bitline signal BLT. A PMOS transistor 173 has a source connected to a drain of the PMOS transistor 171, a gate connected to the true bitline signal BLT, and a drain connected to the DATA signal. A charge trap transistor (CTT) pair 176 is connected to the BLT and BLC signals, a complement wordline WLC, a true wordline WLT, ground (i.e., VSS), and another power supply VSL. An inverter 177 includes a PMOS transistor 174 which has a source connected to the power supply VCS, a gate connected to a gate of a NMOS transistor 175, and a drain connected to a drain of the NMOS transistor 175. The NMOS transistor 175 has its source connected to ground (i.e., VSS). The drain of the NMOS transistor 174 and the NMOS transistor 175 is also connected to the output Q signal.

In operation of the circuit as shown in FIG. 5, after the CTT pair 176 is programmed (i.e., a write operation), a differential current is developed based on the cross-coupled PMOS transistors 172, 173, which allows a differential voltage to be generated. The DATA signal is sensed (i.e., a read operation is performed) based on the differential voltage. The DATA signal is passed through the inverter 177 and the output Q signal is output from the inverter 177.

During programming (i.e., the write operation), the WRITE signal protects the cross-coupled PMOS transistors 172, 173. In this scenario, the cross-coupled PMOS transistors 172, 173 are turned ON with bitlines (i.e., the true bitline signal BLT and the complement bitline signal BLC) grounded during programming (i.e., the write operation). Further, during programming, the WRITE signal is a value of the power supply VCS. Also programming, the power supply VSL is a value of approximately 1.6 volts. During the read operation, the WRITE signal is a value of ground (i.e., VSS). The power supply VSL is also a value of ground (i.e., VSS) during the read operation, providing a path to ground through the charge trap transistor (CTT) pair.

The circuits described in the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for sensing circuits for charge trap transistors of the present disclosure has been adopted from integrated circuit (IC) technology. For example, the structures are built on wafers and are realized in films of material patterned by photolithographic processes on the top of a wafer. In particular, the fabrication of the circuit and the method for sensing circuits for charge trap transistors uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A sensing circuit for sensing data stored in a memory cell including a twin cell transistor pair, the sensing circuit comprising:
an amplifying circuit including first and second delay circuits, wherein the amplifying circuit of the sensing circuit is configured to amplify threshold voltages of transistors of the twin cell transistor pair; and
a logic circuit, wherein the logic circuit of the sensing circuit is configured to:
receive, respectively from the first and second delay circuits of the amplifying circuit, a first output and a second output indicative of the amplified threshold voltages of the transistors of the twin cell transistor pair;
sense, based on the first output and the second output, a difference between the amplified threshold voltages of the transistors of the twin cell transistor pair;
determine the data stored in the memory cell based on the sensed difference between the amplified threshold voltages of the transistors of the twin cell transistor pair; and
output a data output signal indicative of the data determined to be stored in the memory cell.

2. The sensing circuit of claim 1, wherein the transistors of the twin cell transistor pair include a true transistor and a complement transistor, and wherein the amplifying circuit comprises:
the first delay circuit connected to the complement transistor through a complement bitline signal and configured to receive an input signal and to generate the first output indicative of a first one of the amplified threshold voltages corresponding to the complement transistor; and
the second delay circuit connected to the true transistor of the twin cell transistor pair through a true bitline signal and configured to receive the input signal and to generate the second output indicative of a second one of the amplified threshold voltages corresponding to the true transistor.

3. The sensing circuit of claim 2, wherein the twin cell transistor pair is activated by a wordline which is set at a statistical average of a mean threshold voltage of the twin cell transistor pair enable a path to ground.

4. The sensing circuit of claim 3, wherein the wordline is generated by a read voltage generator.

5. The sensing circuit of claim 2, wherein one of the complement transistor and the true transistor is programmed to increase a delay in one of the first delay circuit and the second delay circuit relative to the other one of the first delay circuit and the second delay circuit.

6. The sensing circuit of claim 5, wherein the logic circuit comprises a D Flip-Flop circuit which is configured to receive the first output of the first delay circuit as a data input, receive the second output of the second delay circuit as a clock input, and output the data output signal.

7. The sensing circuit of claim 6, wherein a value of the data output signal is based on the delay in one of the first delay circuit and the second delay circuit.

8. The sensing circuit of claim 7, wherein the value of the data output signal is "1" in response to the delay occurring on the second delay circuit relative to the first delay circuit.

9. The sensing circuit of claim 7, wherein the value of the data output signal is "0" in response to the delay occurring the first delay circuit relative to the second delay circuit.

10. The sensing circuit of claim 2, further comprising a latch which has a clock controlled by a first delay path of the first delay circuit and has a delay to the latch controlled by a second delay path of the second delay circuit.

11. A method for sensing data stored in a memory cell including a twin cell transistor pair, the method comprising:
programming one of a true transistor and a complement transistor of the twin cell transistor pair;
comparing a first delay through a first delay circuit connected to the complement transistor with a second delay through a second delay circuit connected to the true transistor after programming one of the true transistor and the complement transistor;
sensing a threshold voltage difference between the true transistor and the complement transistor based on a comparison of the first delay with the second delay; and
outputting a data signal based on the sensed threshold voltage difference between the true transistor and the complement transistor.

12. The method of claim 11, wherein the programmed one of the true transistor and the complement transistor has a weakened threshold voltage due to the programming.

13. The method of claim 12, wherein the data signal outputs a "1" in response to the first delay of the first delay circuit being less than the second delay of the second delay circuit.

14. The method of claim 13, wherein the data signal outputs a "0" in response to the first delay of the first delay circuit being greater than the second delay of the second delay circuit.

15. The method of claim 11, further comprising activating the twin cell transistor pair by a wordline which is set at a statistical average of a mean threshold voltage of the twin cell transistor pair to enable a path to ground.

* * * * *